United States Patent [19]

Logan et al.

[11] 4,362,611

[45] Dec. 7, 1982

[54] QUADRUPOLE R.F. SPUTTERING SYSTEM HAVING AN ANODE/CATHODE SHIELD AND A FLOATING TARGET SHIELD

[75] Inventors: Joseph S. Logan, Poughkeepsie; Steve I. Petvai, Wappingers Falls; Cornel Rosu, Woodstock, all of N.Y.

[73] Assignee: International Business Machines Corporation, Armonk, N.Y.

[21] Appl. No.: 287,452

[22] Filed: Jul. 27, 1981

[51] Int. Cl.³ ............................................. C23C 15/00
[52] U.S. Cl. ................................................... 204/298
[58] Field of Search ........................................ 204/298

[56] References Cited

U.S. PATENT DOCUMENTS

| | | |
|---|---|---|
| 3,507,774 | 4/1970 | Muly et al. ............................ 204/298 |
| 3,544,445 | 12/1970 | Moseson et al. . |
| 3,730,873 | 5/1973 | Pompei et al. . |
| 3,864,239 | 2/1975 | Fletcher et al. . |
| 3,890,217 | 6/1975 | Burrows et al. ..................... 204/298 |
| 3,913,520 | 10/1975 | Berg et al. ........................... 204/298 |
| 3,985,635 | 10/1976 | Adam et al. . |
| 4,014,779 | 3/1977 | Kuehnle . |
| 4,038,171 | 7/1977 | Moss et al. . |
| 4,060,470 | 11/1977 | Clarke ................................. 204/298 |
| 4,094,764 | 6/1978 | Boucher et al. . |
| 4,116,794 | 9/1978 | Penfold et al. ...................... 204/298 |
| 4,131,533 | 12/1978 | Bialko et al. ........................ 204/298 |
| 4,279,216 | 7/1981 | Buhl et al. ........................... 204/298 |

OTHER PUBLICATIONS

Logan IBM J. Res. Develop. Mar., 1970, pp. 172-175.

*Primary Examiner*—Arthur P. Demers
*Attorney, Agent, or Firm*—Henry Powers

[57] ABSTRACT

A quadrupole sputtering system having four electrodes comprised of a cathode, an anode, a cathode/anode shield and an electrically floating target shield circumscribing the source target of the cathode.

12 Claims, 4 Drawing Figures

QUADRUPOLE R.F. SPUTTERING SYSTEM HAVING AN ANODE/CATHODE SHIELD AND A FLOATING TARGET SHIELD

DESCRIPTION

TECHNICAL FIELD

This invention relates to apparatus for sputtering materials, such as insulators, onto work-pieces, and more particularly to a quadrupole R.F. (radio frequency) sputtering system for depositing coatings on substrates.

One object of the present invention is to provide a novel quadrupole sputtering apparatus for reducing flaking from the interior of the structure and contamination of the coatings deposited on work-pieces from elements of the system.

Another object of the present invention is to provide a novel quadrupole sputtering apparatus with very low susceptibility to arcing due to mechanical configuration.

Another object of this invention is to provide a novel RF quadrupole sputtering system with a reduced RF field gradient across a source target therein.

Another object of the present invention is to provide a novel quadrupole RF sputtering system which is also characterized with a reduced RF field gradient, at the edge of a target therein.

Another object of the present invention is to provide a novel quadrupole RF sputtering system adapted to provide improved coverage of deposited films and versatility.

BACKGROUND ART

In sputtering systems of the general type herein described, a high vacuum gas is ionized between two electrodes, and a target of the material to be sputtered is located in the ionized region where ions bombard the target and dislodge atomic size particles. A substrate or work-piece is positioned to have the sputtered material deposited on its surface. For sputtering a conductive material, the target can be constructed to function as the cathode electrode. For sputtering a dielectric material such as silicon dioxide, silicon nitride, glass, quartz and the like, the target can be mounted on the cathode electrode. The substrates are usually positioned on the anode electrode. In the application of interest herein, sputtering is illustrated in the formation of thin coatings on semiconductor substrates for the fabrication of integrated circuit devices.

Typical timed RF sputter deposition systems are described in U.S. Pat. No. 4,131,533 issued Dec. 26, 1978 to J. A. Bialko et al, and in the article by J. S. Logan entitled "Control of RF Sputtered Film Properties Through Substrate Tuning", IBM Journal of Research and Development, Volume 147, pages 172-175, 1970.

RF sputtering with radio frequency in the low Megahertz range, for example from about 13 MHz up to around 40 MHz, is a typical range that is employed in the art. With properly selected frequency and applied voltage, the sputtering action can be confined to the target, e.g. dielectric, alone or the sputtering action may also occur from the substrates disposed on the anode, whereby atomic particles are "resputtered" from the substrates, similar to the sputtering which occurs from the target material comprising the cathode.

In any sputtering operation, it is desirable that only target material or, in the case of resputtering (as for sputter etching) substrate material be ejected. Therefore, it has been found necessary to protect other parts or elements of the sputtering system associated with the cathode and anode from the bombarding action of the ions. This can be accomplished by placing shields, normally grounded, around the cathode or anode or both. However, in RF sputtering, such shielding is not without penalties since such shields can divert current from the electrodes.

Operation of tuned substrate coating or deposition systems with high resputtering levels brings into play the so-called "flip point" or point of system instability which occurs at maximum resputtering. In the case of some 13 MHz systems, it can be estimated from voltage measurements, that planar mode operation (e.g. planar coatings on substrates), is achieved at 56% of maximum resputtering, as compared to 40 MHz systems which must operate at 85% of maximum resputtering. This means that the 40 MHz systems have a much narrower margin of safety for normal deviations.

Also, in conventional sputtering systems, the plasma is sensitive to mechanical set-up tolerances and background pressure variations which manifest themselves by arcing. Minor arcs will leave a light brown spot on a cathode shield ring. Major arcs will leave a dark blue or black scorched mark on the cathode shield ring and the chamber walls. In some cases the arc is visible. In such a case, a small fire-ball emitting intense bluish white light will track along the chamber wall until the RF power is removed from the electrodes. The arcs can also melt the surface of the metal chamber, which melted particles will spray all over in the chamber, causing potential product yield reduction. As is obvious, this is an unacceptable condition in sputtering systems wherein an insulating layer is deposited over thin metal conductors on a surface of semiconductor devices. Accordingly, an RF sputtering system is desired with reduced arcing, increased stability and reduced flaking contamination.

BRIEF DESCRIPTION OF THE DRAWINGS

In the accompanying drawings forming a material part of this invention.

DISCLOSURE OF THE INVENTION

For a further comprehension of the invention, and of the objects and advantages thereof, reference will be had to the following description and accompanying drawings and to the appended claims in which the novel features of the invention are more particularly set forth.

The present invention comprises a novel RF quadrupole sputtering system which incorporates a fourth electrode assembly to conventional triode sputtering systems. The system includes a spaced and opposed cathode and anode units circumscribed by a grounded shield assembly as would normally comprise a triode system. As will be understood, where the sputtering unit is employed for deposition of dielectric material, a dielectric source will be mounted on the cathode surface facing the anode, whereas, when appropriate, the cathode surface can form the source for deposition of like composition conductive coatings.

As indicated, the sputtering system of this invention includes a fourth electrode comprising an electrically floating target or secondary cathode shield circumscribing the target in spaced relation therewith forming a plasma suppression gap optimally in the range of about 0.01 to about 0.024 inches. Preferably the target shield is recessed or indented from the face of the target surface a distance of about 0.05 to about 0.07 inches. For convenience, the target shield can be insulatively mounted to the cathode shield with a suitable spacing or gap such as about 0.01 to 0.03 inches.

In the preferred form the cathode shield will include an inwardly protruding projection which will circumscribe and extend in spaced relation within a peripheral portion of the cathode adjacent the source target surface. This embodiment comprises a peripheral groove or recess within and about the cathode adjacent and spaced from the target face. Where a discrete target source is mounted on the cathode, thin grooves can take the configuration of a stepped shoulder, which can form with the target element a u-shaped channel or groove.

The cathode shield extension of the preferred embodiment, can comprise a conductive annular ring mounted to the cathode shield proper, with the inner peripheral portion of the ring extending in spaced relationship within the grooved channel and circumscribing the cathode element. The inner periphery of the ring will form with the cathode element an arc suppression gap, preferably in the range of about 0.06 to about 0.12 inches.

In operations the work-pieces or substrates will be positioned on the anode plate in sputtering relationship with the target surface of the cathode. For sputtering deposition of a dielectric material on semiconductor substrates or wafers, they will normally be supported on or within recessed pockets of a quartz plate carrier which is disposed on the anode face.

BEST MODE FOR CARRYING OUT THE INVENTION

Figure 2:
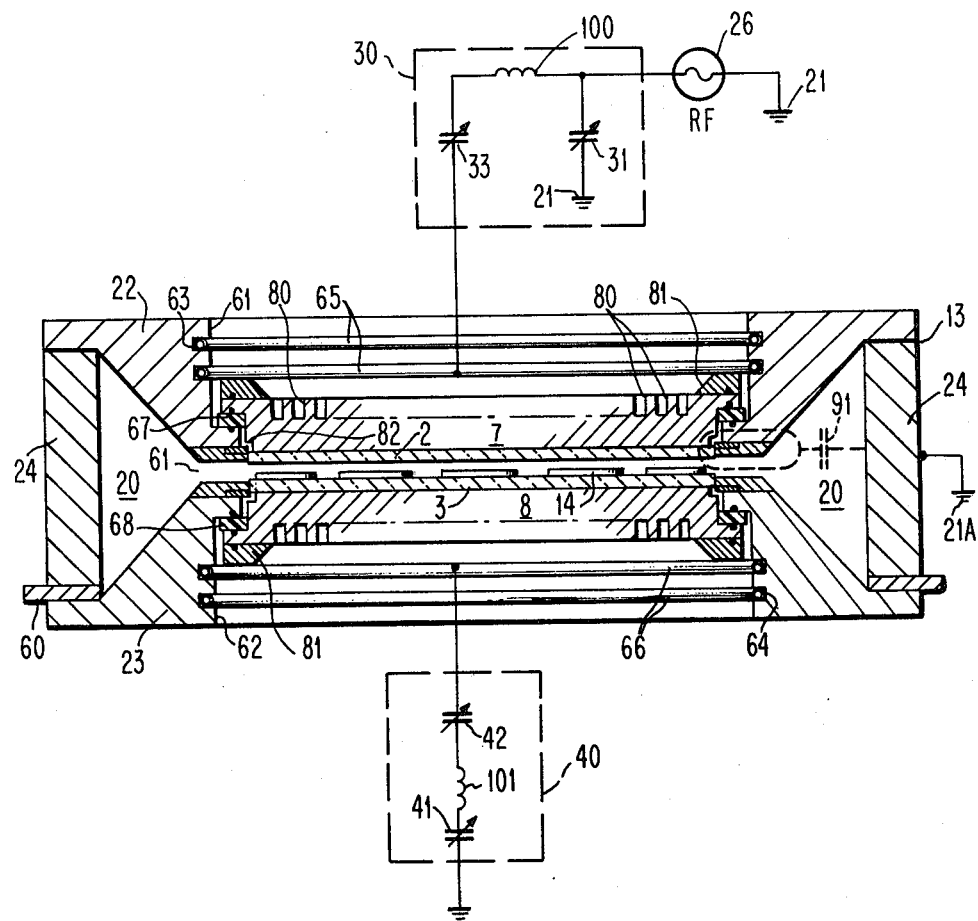
FIG. 2 is a cross-sectional view illustrating the electrode/shield assemblies of the quadrupole sputtering system of this invention.
Figure 3:
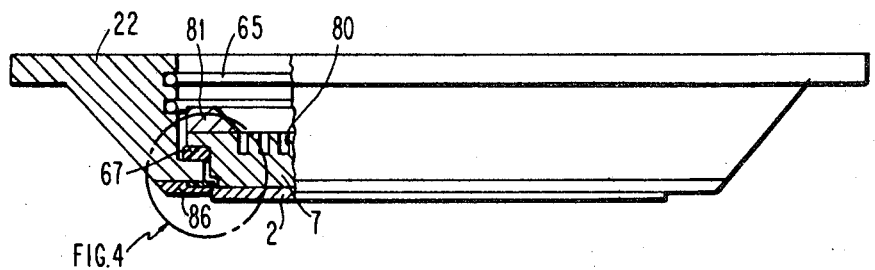
FIG. 3 is an elevational view partly in cross-section of a cathode assembly in association with its shield elements.

Referring to the drawings there is shown an embodiment 50 of the quadrupole sputter of this invention having a sight glass 51 and a pump port 52. Also included is a cathode network box 53 (31, 33, FIG. 2) and an anode network box 54 (41, 42, FIG. 2).

The system includes a low pressure gas ionization chamber 20 which is connected to a first reference potential 21, normally grounded. Chamber 20 includes an upper annular section 22 and an annular section 23 secured about a collar 24 and a spacer ring 60 whose thicknesses can be varied to define the spacing 61 between upper and lower sections 22 and 23 in accordance with sputtering requirements. Also machined in the inner walls 61 and 62 of respective annular sections 22 and 23, are recessed channel pockets 63 and 64 for receiving and sealing tubing 65 and 66 through which a suitable heat exchange fluid (e.g. DI water) is circulated to controlled cooling of the sputtering unit.

Hermetically positioned on the chamber ring 22, by an insulating ring 67 and O-rings 71 and 72, is a target or cathode electrode 7 (e.g. copper plated aluminum or copper) having mounted on it a disc or plate 2 of the material to be sputtered, e.g. high purity silica, quartz, $SiO_2$, glass and the like for deposition of dielectric or insulating coatings. In this configuration the upper chamber section 22 will serve as a cathode shield 13 connected to ground 21A, as through chamber collar 24. These chamber elements (22, 23, 24 and 60) are fabricated, normally of conductive material (e.g. aluminum, aluminum lined stainless steel, etc.) and thus in conductive relationship to each other.

Disposed in proximate relationship with the cathode is a substrate holder, electrode or anode 8 (e.g. aluminum), hermetically secure to the lower chamber section 23 by means of an insulator ring 68. In this configuration the lower chamber sections 23 will serve as an anode shield when connected to ground 21A, as through chamber collar 24. Disposed on the top or inner face or surface of anode 8 is a support plate or carrier 3 on which are positioned the work-piece substrates 14, as for example semiconductor integrated circuit wafers on which is deposited a coating of silicon dioxide (glass) which is ejected from the silica target 2. As will be understood, the carrier 3 can have recessed pockets (not shown) for receiving the substrates 14.

A suitable ionizable gas (e.g. argon) forms the ambient in chamber 20 via an inlet (not shown), at for example 100 sccm (standard ccs per minute), and maintained at low pressure e.g. 25 microns, via pump port 52, by means of a suitable vacuum pump (not shown) and a controller (also not shown).

Machined in the backside of cathode 7 is a heat exchange channel 80 contained within a cover plate 81. In operation a suitable coolant (e.g. DI water) is circulated in the channel 80 by means of an inlet and outlet (not shown) to maintain the required processing temperatures for the cathode. A similar heat exchange means (not shown) can be provided at the backside of anode 8 for control of temperatures thereat.

Figure 4:
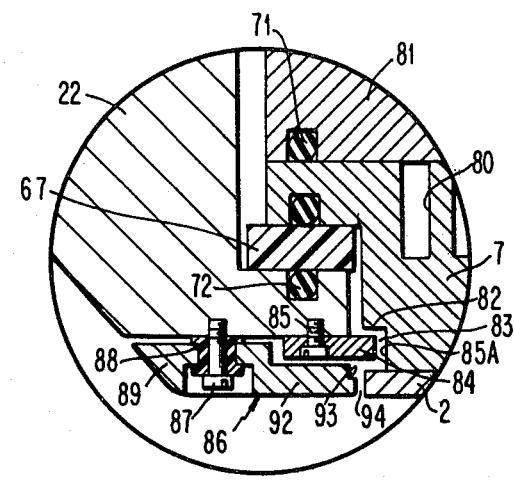
FIG. 4 is a cross-sectional view illustrating the details of the mounting of shield elements to a cathode/target unit.

As shown more clearly in FIG. 4, the cathode 7 has a stepped shoulder 82, adjacent target 2, so as to form therewith a channel or groove 83 into which extends, in spaced relationship, the inner peripheral portion of a grounded reverse suppression shield ring 84, mounted to cathode shield 22 (upper chamber section), by fastener 85, in electrical connection therewith. Typically the depth of the shoulder 82 will be about $0.370 \pm 0.01$ inches, with the inner perimeter of the shield ring 84 forming an arc suppression gap 83 (optimally of about 0.06 to about 0.12 inches) with the vertical groove wall 85A of cathode 7.

Also mounted on the cathode shield 22 is an electrically floating offset forward suppression ring shield 86 insulatively mounted by means of fastener 87 and an insulating spacer (3M Kel-F or DuPont polyimide) 88 which spaces the outer segment 89 at a distance or gap 90 from the cathode shield 22. This field emission gap 90 is optimally about 0.01 to about 0.03 inches, with the mounting forming a capacitance (shown in phantom in FIG. 2) with ground 21A, via the conductive elements of the sputter chamber enclosure. The inner segment 92 of the floating ring has a stepped inner peripheral portion 93 adjacent the target 2 to form therewith a plasma suppression gap 94, optimally of about 0.01 to about 0.024 inches. Also, in the preferred form the ring shield 86 will have inner segment 92 recessed or displaced aft of the surface of the target source a distance of about 0.05 to about 0.07 inches.

An RF generator 26 is connected between a first reference potential 21, i.e. ground, and a brass stem connector 70 which in turn is electrically connected to the cathode electrode 7. A cathode matching network is connected between RF source 26 and the connector stem 70. Network 30 comprise a capacitor 31 connected to ground 21, an inductor 100, and a second capacitor 33 connected to the contact stem 70. Both of these capacitors are variable so that circuit 30 functions as a variable cathode impedance matching network.

Figure 1:
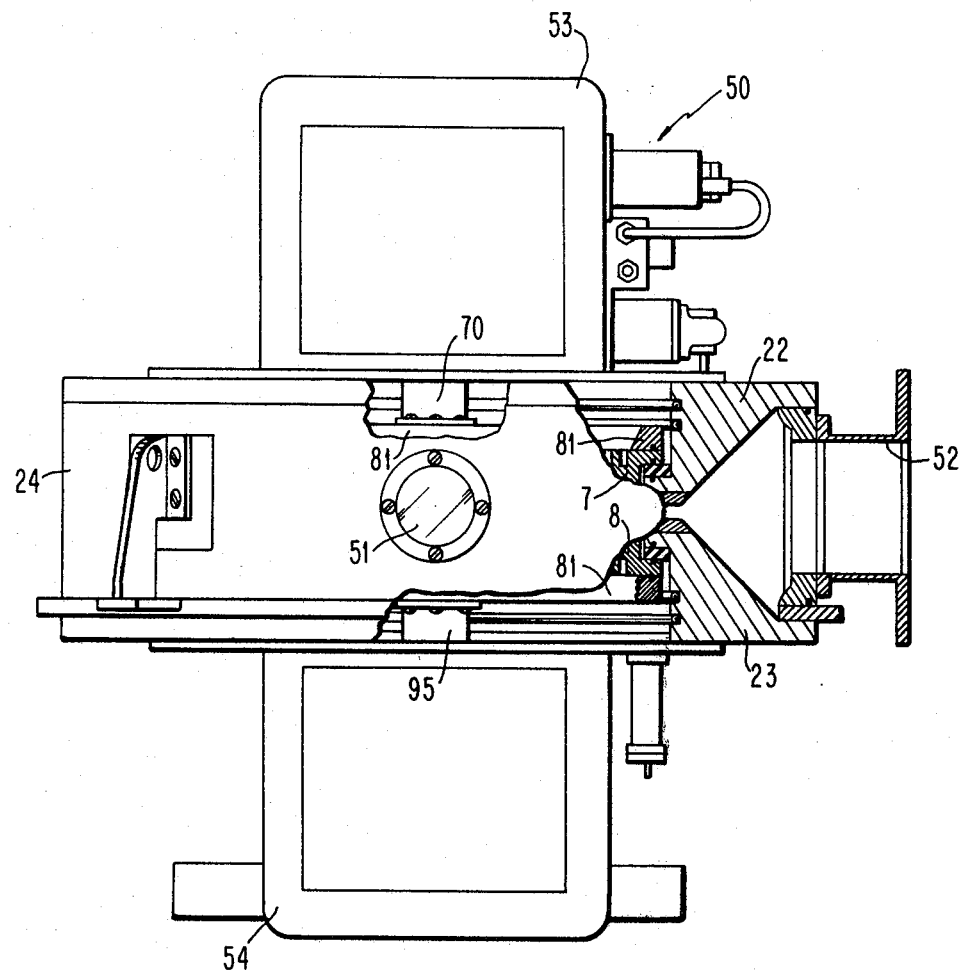
FIG. 1 is an elevational view illustrating the general configuration of the quadrupole RF sputtering unit of this invention with a fragmentary portion illustrating the interior of the system.

Anode 8 is connected through a conductive (brass) stem 95 (FIG. 1) and the anode circuit 40 to ground 21. The network 40 comprises two variable capacitors 41, inductor 101 and capacitor 42, in series between the connecting stem 95 and ground 21.

In experimental runs, it was discovered that the temperature of the forward suppression ring shield 86 had been elevated to the point that it was barely tolerable to the touch (approximately 190° F.), immediately after the depositions. This is believed attributable to the low thermal conductance of the Kel-F or polyimide insulators 88. The change of the ring 86 temperatures from a conventional 65° F. to about 195° F. provides an advantage in that it is beneficial in the $SiO_2$ adhesion to the aluminum surfaces of the ring 86 by reducing glass flaking in the process chamber 20, hence extending the tooling usable life between cleaning.

In a sputter deposition of 12 semiconductor wafers mounted in a like number of pockets of a quartz carrier 3 over 80 glow hours were used between tooling changes, the sputter system of this invention was set up with the following parameters:

4 KW RF Power 40 MHz
1600 volts peak-to-peak cathode voltage, referenced to ground
170 amps plasma current
1100 volts plasma potential, cathode to anode
450 volts peak-to-peak (Vpp) anode voltage, reference to ground
450 angstroms per minute deposition rate
Substrate temperature, 280° C.
Re-emission coefficient, 0.54
Target 2 to carrier 3 spacing 0.0780 inches
Forward suppression ring 86, temperature, 200° C.

The deposition was completed without arcing. The flip point or system stability was found to be improved by 120 Vpp. There was found to be improved $SiO_2$ adhesion to the sputterer elements. Deposition uniformities were improved to be better than ±10% over a 12 wafer batch. Feasibility was demonstrated to increase deposition rates from 300±50 angstroms per minute to over 400 (e.g. 450)±50 angstroms per minute. Feasibility to obtain stable sputtering on a 20 ½ inch diameter pocketless quartz plate 3 with an increased batch of 19 wafers, was also demonstrated.

Our coating thickness measurements resulted in a four-fold (4) uniformity improvements from ±10% to ±2.5%. The above described coatings were produced on a 18 inch diameter quartz plate, resting on the anode, with 12-82 mm diameter wafers nested in pockets.

Experiments on a 20 ½ inch diameter quartz plate, resting on the anode, with 19-82 mm diameter wafers indicated the feasibility to maintain the above indicated uniformity improvements as the systems capacity is increased.

We have attributed these improvements to the floating forward suppression ring application, where the top surface of the ring (~2.5 inch width) was uniformally coated. When the same suppression ring was grounded, only the inner 0.5 inch width of the ring was coated. We call this phenomena plasma stretching.

Runs with the described unit have shown that arcing and instability has been eliminated by the quadrupole design of this invention. This configuration eliminates steep RF power field gradients across the surface of the target. The reduced RF power field gradient is approximately equal to the plasma potential. The uniform RF power distribution across the sputtering target 2 and the suppression ring 86 resulted in excellent system stability. It was found that a 25% improvement obtained in the quadrupole configuration (flip point measurements) as compared to a triode configuration.

The thermally and electrically floating shield ring 86, in the quadrupole configuration resulted in a five times improvement of $SiO_2$ adhesion to the ring's surface.

Thermolysis in the plasma suppression gap 94 was found to be the major contributor for the reduction of flaking (contamination) in the quadrupole configuration. The elevated shield ring 86 temperature (>200° C.-4 KW) has reduced the absorption of wafer vapor and other contamination, which occurs during short term open chamber times (loading/unloading).

Stability and contamination improvements have, in general permitted the relaxation of all the mechanical compliances in the quadrupole, excluding the components responsible for the thermal and electrical floating of the suppression ring 92 (e.g. mounting). This new freedom in machine design enables the obtainment of better $SiO_2$ microstructures with less stress distribution in insulation layers on dense thin films.

Also, the most improved parameter of the syystem is the anode stability. Generally, since perturbations along the RF power transmission path amplifies the anode voltage variations and reamplifies the plasma potential in triode systems, the improvement in anode voltage stability (or resputtering is attributed to the quadrupole design.

While the invention has been illustrated and described with preferred embodiments of this invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A quadrupole sputtering system comprising:
a chamber adapted to be evacuated and to maintain a low pressure ionizable gas therein;
a cathode electrode, disposed in said chamber, with a source target surface therein;
an anode electrode, in said chamber, adapted for mounting work piece substrates thereon, with said anode electrode disposed in face-to-face sputtering relationship with said target surface of said cathode electrode;
a spaced ground shield circumscribing said cathode electrode;
an electrically floating shield circumscribing said target surface; and
means for applying an operating potential between said cathode and anode electrodes for sputtering of material from said target surface on said substrates.

2. The sputtering system of claim 1 including a grounded anode shield.

3. The sputtering system of claim 2 wherein said anode shield is conductively integrated to said cathode shield to form an extension therefrom with said cathode and anode electrodes and said cathode and anode shields comprising a confining enclosure of said chamber.

4. The sputtering system of claim 1, including a peripheral recess in and circumscribing said cathode electrode adjacent said target surface, and a projecting extension of said cathode shield extending in spaced relationship into said recess around said cathode electrode.

5. The sputtering system of claim 4 including a grounded anode shield.

6. The sputtering system of claim 5 wherein said anode shield is conductively integrated to said cathode shield to form an extension therefrom with said cathode and anode electrodes and said cathode and anode shields comprising a confining enclosure of said chamber.

7. The sputtering system of claim 4 wherein said target surface comprises a discrete source substrate mounted on said cathode electrode.

8. The sputtering system of claim 7 including a grounded anode shield.

9. The sputtering system of claim 8 wherein said anode shield is conductively integrated to said cathode shield to form an extension therefrom with said cathode and anode electrodes and said cathode and anode shields comprising a confining enclosure of said chamber.

10. The sputtering system of claim 4 wherein said target surface comprises a discrete source substrate mounted on said cathode electrode in overhanging relationship therewith to comprise a wall portion of said recess.

11. The sputtering system of claim 10 including a grounded anode shield.

12. The sputtering system of claim 11 wherein said anode shield is conductively integrated to said cathode shield to form an extension therefrom with said cathode and anode electrodes and said cathode and anode shields comprising a confining enclosure of said chamber.

* * * * *